US008542490B2

(12) United States Patent
Kokas et al.

(10) Patent No.: US 8,542,490 B2
(45) Date of Patent: Sep. 24, 2013

(54) VERTICALLY MOUNTED MULTI-HYBRID MODULE AND HEAT SINK

(75) Inventors: Jay W. Kokas, East Granby, CT (US); Kevin P. Roy, West Springfield, MA (US); Judy Schwartz, Longmeadow, MA (US); Michael Maynard, Springfield, MA (US); John D. Pennell, Enfield, CT (US); Matthew S. Fitzpatrick, Portland, CT (US); Richard M. Speziale, Winsted, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 232 days.

(21) Appl. No.: 13/161,842

(22) Filed: Jun. 16, 2011

(65) Prior Publication Data

US 2012/0320530 A1    Dec. 20, 2012

(51) Int. Cl.
*H05K 7/20* (2006.01)
(52) U.S. Cl.
USPC ...... 361/715; 361/679.54; 361/708; 361/721; 361/704; 165/80.3; 165/104.33; 165/185
(58) Field of Classification Search
USPC ............ 361/679.46, 679.54, 704–712, 715, 361/719, 721–724, 736, 737, 749, 760, 785, 361/788, 796; 165/80.3, 104.33, 185; 174/16.3, 50, 51, 54, 520, 252; 257/713, 257/718; 312/223.2, 223.3, 236
See application file for complete search history.

(56) References Cited

U.S. PATENT DOCUMENTS

| | | | | |
|---|---|---|---|---|
| 3,215,194 A * | 11/1965 | Sununu et al. | | 165/80.3 |
| 3,217,793 A * | 11/1965 | Coe | | 165/80.3 |
| 3,243,660 A * | 3/1966 | Yuska et al. | | 361/709 |
| 3,395,318 A * | 7/1968 | Laermer et al. | | 361/772 |
| 3,506,877 A * | 4/1970 | Owen | | 361/715 |
| 3,987,344 A * | 10/1976 | Ambruoso et al. | | 361/708 |
| 4,558,209 A * | 12/1985 | Hess | | 219/530 |
| 4,602,315 A * | 7/1986 | Breese | | 361/709 |
| 4,642,735 A * | 2/1987 | Hodsdon et al. | | 361/816 |
| 4,780,792 A * | 10/1988 | Harris et al. | | 361/737 |
| 4,785,379 A * | 11/1988 | Goodrich | | 361/711 |
| 4,933,746 A * | 6/1990 | King | | 257/718 |
| 5,218,516 A * | 6/1993 | Collins et al. | | 361/721 |
| 5,297,025 A * | 3/1994 | Shoquist et al. | | 361/704 |
| 5,482,109 A * | 1/1996 | Kunkel | | 165/80.3 |
| 5,883,789 A | 3/1999 | O'Coin | | |
| 6,064,575 A * | 5/2000 | Urda et al. | | 361/721 |
| 6,068,051 A * | 5/2000 | Wendt | | 165/185 |
| 6,104,613 A * | 8/2000 | Urda et al. | | 361/704 |
| 6,320,750 B2 * | 11/2001 | Shaler et al. | | 361/736 |
| 6,324,059 B1 * | 11/2001 | Werner | | 361/704 |
| 6,661,664 B2 | 12/2003 | Sarno et al. | | |
| 7,061,766 B2 | 6/2006 | Wainwright et al. | | |
| 7,869,216 B2 * | 1/2011 | Stevenson et al. | | 361/708 |
| 2010/0302729 A1 | 12/2010 | Tegart et al. | | |

* cited by examiner

Primary Examiner — Michail V Datskovskiy
(74) Attorney, Agent, or Firm — Kinney & Lange, P.A.

(57) ABSTRACT

A multi-hybrid module includes a plurality of hybrid assemblies that are perpendicularly mounted with respect to a plane of a circuit board. The hybrid assemblies are mounted on opposing sides of a heat sink. The heat sink has a first column disposed at a first end, a second column disposed at a second opposing end, and a generally flat center wall extending between the first column and the second column to which the hybrid assemblies are mounted. During operation the hybrid assemblies are mounted on edge perpendicular with respect to the circuit board to minimize an area profile of the multi-hybrid module on the circuit board.

19 Claims, 2 Drawing Sheets

VERTICALLY MOUNTED MULTI-HYBRID MODULE AND HEAT SINK

BACKGROUND

The invention is directed to electronics packaging, and more particularly, to an electronic assembly with a hybrid electronics package mounted vertically with respect to a circuit board.

Electronics packaging is used to protect microelectronics and circuitry by typically encasing them in a sealed high-temperature plastic housing. In the avionics industry, this electronics packaging is then affixed to a circuit board, such as a printed circuit board, which is mounted within an electronic box, frequently along with other similar printed circuit board assemblies for electronic control. The electronics packaging must be mounted to the printed circuit board so as to withstand the harsh mechanical, structural, electrical, and thermal requirements of the avionics environment.

Conventional practice for electronics packaging is to populate the printed circuit board with commercial-off-the-shelf electrical components that extend just above the surface of the printed circuit board along a horizontal plane parallel thereto. However, this arrangement does not optimize the space and weight of the resulting assembly, as populating each circuit board with additional electrical components to achieve desired functionality increases the overall surface area of the printed circuit board.

SUMMARY

A multi-hybrid module includes a plurality of hybrid assemblies that are perpendicularly mounted with respect to a plane of a circuit board. The hybrid assemblies are mounted on opposing sides of a heat sink. The heat sink has a first column disposed at a first end, a second column disposed at a second opposing end, and a generally flat center wall extending between the first column and the second column to which the hybrid assemblies are mounted. During operation the hybrid assemblies are mounted on edge perpendicular with respect to the circuit board to minimize an area profile of the multi-hybrid module on the circuit board.

In another aspect, the multi-hybrid module utilizes flexible lead terminations that allow for a compliant attachment to the circuit board. The compliant lead configuration along with the configuration of the heat sink which efficiently transfers heat out of the hybrid and allows the multi-hybrid module to be mechanically secured to the circuit board and survive in a harsh high temperature and high vibration environment.

DETAILED DESCRIPTION

Figure 1:
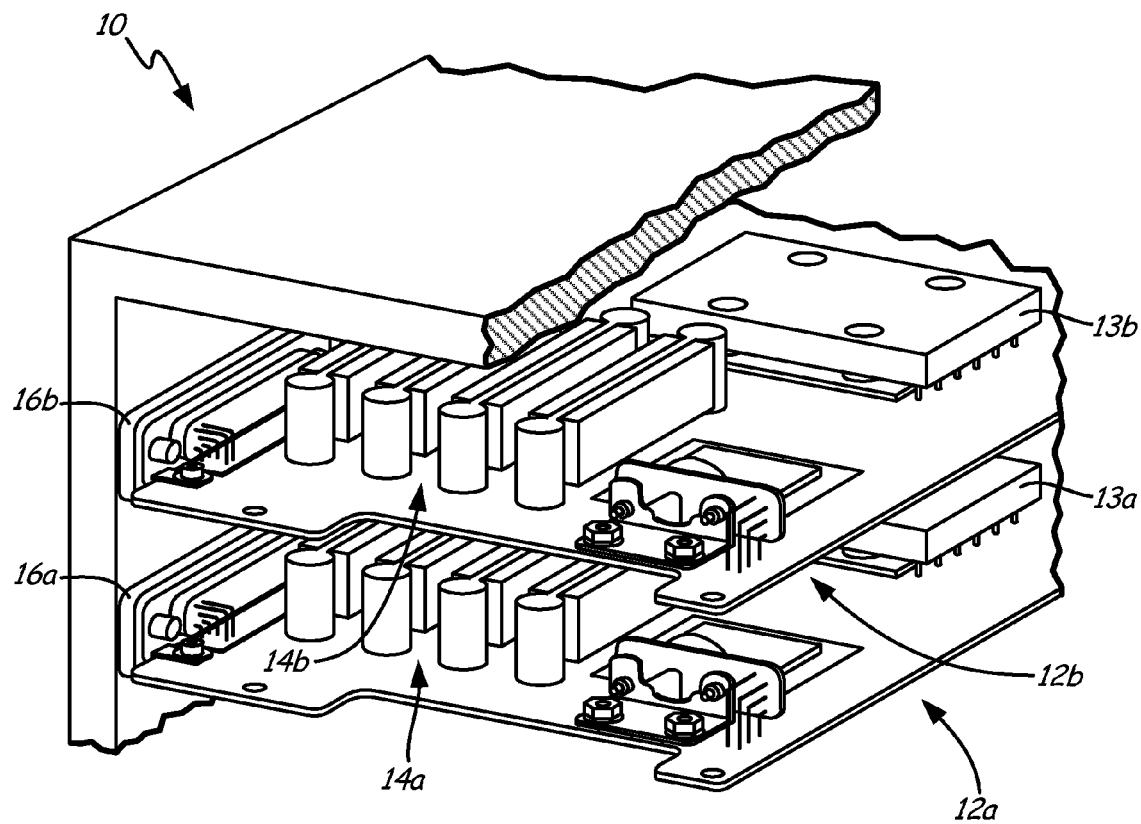
FIG. 1 is a perspective view of a portion of an electrical box which houses at least two circuit boards with electronic components and multi-hybrid modules mounted thereto.

FIG. 1 shows a perspective view of a portion of an electrical box or housing 10. Electrical box 10 houses a plurality of circuit boards therein (only two circuit boards 12a and 12b are shown in the portion of the electrical box 10 illustrated in FIG. 1). In addition to circuit boards 12a and 12b, electrical box 10 houses microprocessors 13a and 13b, multi-hybrid modules 14a and 14b, and features 16a and 16b.

Electrical box 10 is of standard construction with a chassis constructed of a metal such as aluminum. Electrical box 10 surrounds circuit boards 12a and 12b and houses circuit boards 12a and 12b in a stack formation therein. Circuit boards 12a and 12b comprise printed circuit boards and are populated with a plurality of electronic components such as microprocessors 13a and 13b and multi-hybrid modules 14a and 14b. Circuit boards 12a and 12b are mechanically supported relative to electrical box 10 by features 16a and 16b. Each circuit board 12a and 12b mechanically supports and electrically connects components such as microprocessor 13a and multi-hybrid module 14a using conductive pathways. Microprocessors 13a and 13b are illustrated for exemplary purposes in FIG. 1, and are one of many electronic components that circuit board 12a can be populated with based on desired functionality.

Multi-hybrid modules 14a and 14b will be discussed in detail subsequently, however, FIG. 1 illustrates that multi-hybrid modules 14a and 14b are configured to mount generally perpendicularly with respect to circuit boards 12a and 12b, respectively. This configuration allows multi-hybrid modules 14a and 14b to utilize the vertical space between circuit board 12a and circuit board 12b, and chassis of electrical box 10, while still meeting the mechanical, structural, electrical, and thermal requirements of the avionics environment in which multi-hybrid modules 14a and 14b are disposed. With the vertical configuration described, the size and weight of each circuit board 12a and 12b can be reduced. More particularly, by mounting multi-hybrid modules 14a and 14b generally perpendicularly with respect to circuit boards 12a and 12b so as to reduce multi-hybrid modules 14a and 14b horizontal profiles (area) on circuit boards 12a and 12b, the area of circuit boards 12a and 12b can be reduced by over 75 percent, and the weight of each circuit board 12a and 12b can be significantly reduced.

Figure 2:
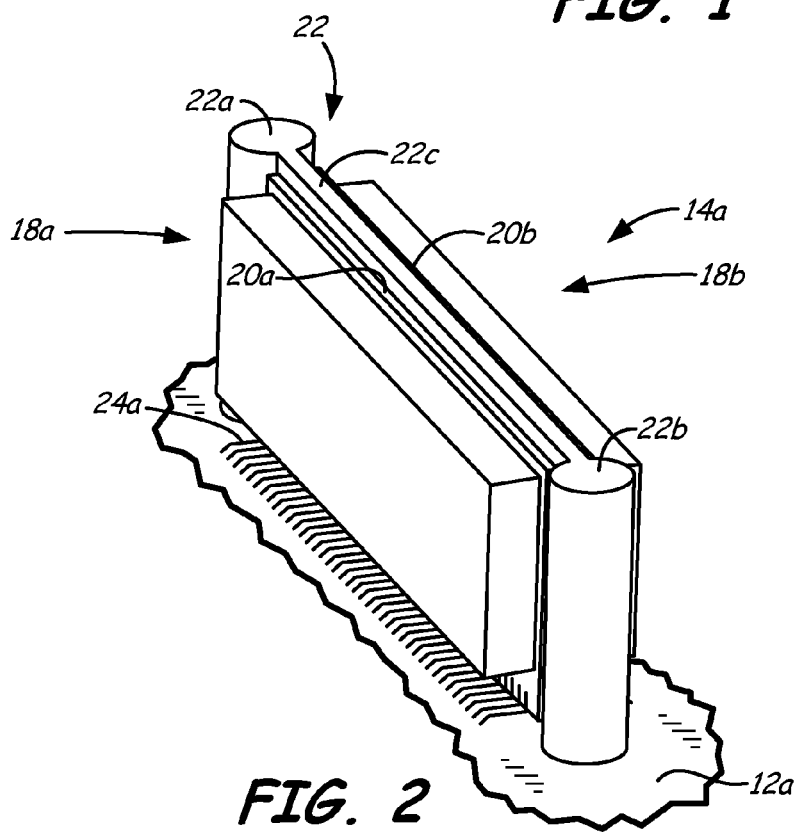
FIG. 2 is a perspective view of one of the multi-hybrid modules of FIG. 1 showing a heat sink, substrates, and two hybrid assemblies.

FIG. 2 shows one multi-hybrid module 14a mounted on circuit board 12a. Multi-hybrid module 14a includes a first hybrid assembly 18a, a second hybrid assembly 18b, a first substrate 20a, and a second substrate 20b. First substrate 20a is part of first hybrid assembly 20a and second substrate 20b is part of second hybrid assembly 18b. Multi-hybrid module 14a additionally includes a heat sink 22 and lead terminations 24a and 24b (FIG. 2B). Heat sink 22 includes a first column 22a, a second column 22b, and a center wall 22c.

First and second hybrid assemblies 18a and 18b are mounted on opposing sides of multi-hybrid module 14a from one another. More particularly, heat sink 22 is disposed between first hybrid assembly 18a and second hybrid assembly 18b. Heat sink 22 and first and second hybrid assemblies 18a and 18b are mounted on circuit board 12a so as to extend generally perpendicular with respect thereto. First hybrid assembly 18a and second hybrid assembly 18b are connected to the heat sink 22 via first substrate 20a and second substrate 20b and extend generally vertically with respect to circuit board 12a. Outer cover of first hybrid assembly 18a is bonded to generally flat first substrate 20a which in turn is bonded on heat sink 22. Bonding can be accomplished by a high temperature adhesive such as an epoxy. More particularly, first substrate 20a is mounted on a first side of center wall 22c between first column 22a and second column 22b and has a lower edge that is contacted by lead terminations 24a. Similarly, second hybrid assembly 18b has an outer cover that is bonded to generally flat second substrate 20b which in turn is bonded on heat sink 22. More particularly, second substrate 20b is mounted on an opposing side of center wall 22c from first substrate 20a between first column 22a and second column 22b and has a lower edge that is contacted by lead terminations 24b (FIG. 2B). Lead terminations 24a are disposed about the lower portion of first substrate 20a and connect between circuit board 12a contacts and contacts in first substrate 20a to accomplish an electrical connection. Similarly, lead terminations 24b are disposed about the lower portion of second substrate 20b and connect between circuit board 12a contacts and contacts in second substrate 20b to accomplish an electrical connection.

First and second hybrid assemblies 18a and 18b with outer covers made of a high temperature plastic, or metal, such as aluminum, house one or more electronic components therein. First and second substrates 20a and 20b comprise circuitry that supports electrical components housed within first and second hybrid assemblies 18a and 18b. First and second substrates 20a and 20b have electrical conductors thereon that connect the electrical components to circuit board 12a via lead terminations 24a and 24b. First and second substrates 20a and 20b are fabricated from a ceramic material that is thermally conductive but electrically insulating.

Heat sink 22 comprises a metal, such as aluminum, and provides a thermal pathway for heat to be transferred away from the one or more electronic components housed in first and second hybrid assemblies 18a and 18b to circuit board 12a. First column 22a and second column 22b comprise posts and are connected by center wall 22c so as to form pockets in which first hybrid assembly 18a and second hybrid assembly 18b can be mounted. First column 22a, second column 22b, and center wall 22c have a vertical orientation, such that they are mounted to circuit board 12a so as to be generally perpendicular to a plane defined by the surface of circuit board 12a. The size of heat sink 22, including first column 22a, second column 22b, and center wall 22c can be altered to meet operational criteria such as vibration levels and the required amount of heat transfer away from first and second hybrid assemblies 18a and 18b.

Figure 2A:
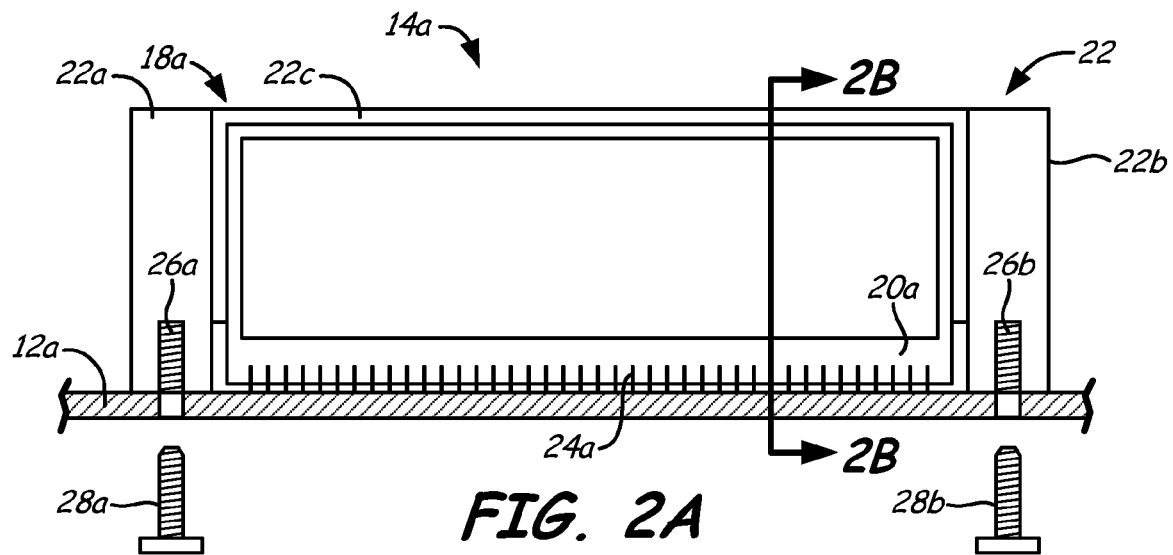
FIG. 2A is side view of the multi-hybrid module of FIG. 2.
Figure 2B:
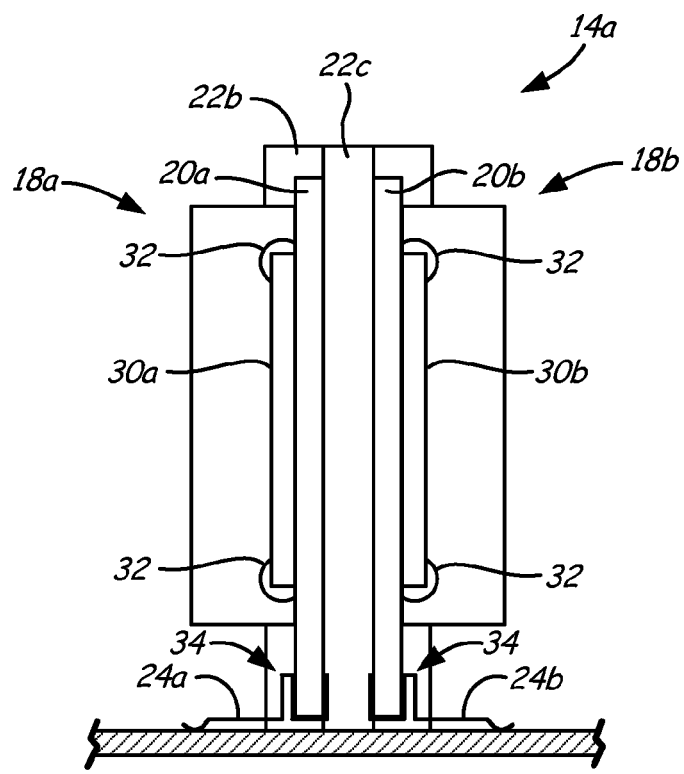
FIG. 2B is a sectional view of the multi-hybrid module of FIG. 2A taken along line B—B and showing electrical components internal to the multi-hybrid module.

FIG. 2A shows a side view of multi-hybrid module 14a. In addition to the features previously discussed, FIG. 2A illustrates that the base portion of first column 22a is threaded hole 26a and the base portion of second column 22b is threaded hole 26b. Threaded holes 26a and 26b receive fasteners 28a and 28b, respectively. This allows multi-hybrid module 14a to mount on circuit board 12a. More particularly, fasteners 28a and 28b extend through circuit board 12a and are received in threaded holes 26a and 26b. First column 22a and second column 22b (along with fasteners 28a and 28b) provide rigidity and support for multi-hybrid module 14a in the harsh avionics environment. In addition to providing rigidity, first and second columns 22a and 22b contact circuit board 12a in order to provide for heat transfer away from multi-hybrid module 14a. Additionally, first and second columns 22a and 22b have exposed surface area adequate to provide for heat transfer to air, if air is being moved across circuit board 12a. Generally flat thinner center wall 22c extends between first column 22a and second column 22b. Flat center portion interfaces with first substrate 20a and second substrate 20b and has adequate surface area to provide for a desired amount of heat transfer away from first and second hybrid assemblies 18a and 18b. Although illustrated as cylindrical in the FIGURES, first column 22a and second column 22b can have any shape as is practical to manufacture.

FIG. 2B shows a cross-section of multi-hybrid module 14a of FIG. 2A. FIG. 2B illustrates a first electronic component 30a, a second electronic component 30b, and bond wires 32. Additionally, lead terminations 24a and 24b include multiple bends 34.

As shown in FIG. 2B, first hybrid assembly 18a and second hybrid assembly 18b are connected to heat sink 22 so as to cantilever from the heat sink 22 above the circuit board 12a. First electronic component 30a is housed in first hybrid assembly 18a and is electrically connected to conductive pads/traces on first substrate 20a by bond wires 32. Similarly, second electronic component 30b is housed in second hybrid assembly 18b and is electrically connected to conductive pads/traces on second substrate 20b by bond wires 32. Lead terminations 24a and 24b are disposed around bottom portions of first substrate 20a and second substrate 20b and have multiple bends 34, which allow lead terminations 24a and 24b to be compliant and flex when contacted by the surface of circuit board 12a when heat sink 22 is mounted. This configuration allows lead terminations 24a and 24b to be coplanar with the surface of circuit board 12a.

For simplicity, first electronic component 30a is illustrated as a single component, housed within first hybrid assembly 18a and disposed on first substrate 20a. However, in other embodiments first electronic component 30a and second electronic component 30b can comprise a plurality of analog or digital electronic components and can be disposed on or adjacent to multiple substrates. A non-exhaustive list of electronic components that can be housed in hybrid assembly 18a and 18b include: various circuits, various microcircuits, resistors, capacitors, diodes, transistors, op-amps, switches, multiplexers, and microprocessors. As disclosed herein, the term "hybrid" refers to electronic components that contain specialized components and features, which allow the electronic components to be used in the avionics environment.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronic assembly comprising:
    a first electronic hybrid assembly, wherein the first electronic hybrid assembly includes a first outer cover;
    a second electronic hybrid assembly, wherein the second electronic hybrid assembly includes a second outer cover; and
    a heat sink having a center wall, the first hybrid assembly and the second hybrid assembly mounted on opposing sides of the center wall from one another and extending away from the heat sink.

2. The electronic assembly of claim 1, wherein the heat sink includes a first column disposed at a first end of the heat sink, a second column disposed at a second opposing end of the heat sink with the center wall extending between the first column and the second column.

3. The electronic assembly of claim 2, wherein the first hybrid assembly and the second hybrid assembly are affixed to either side of the center wall of the heat sink between the first column and the second column.

4. The electronic assembly of claim 2, wherein the first column and second column have threaded holes to receive a fastener that connects the electronic assembly to a circuit board.

5. The electronic assembly of claim 4, wherein the heat sink is mounted on the circuit board so as to extend generally perpendicular with respect to a plane of the circuit board, and wherein the first hybrid assembly and the second hybrid assembly are mounted on the heat sink so as to be edge mounted with respect to the circuit board.

6. The electronic assembly of claim 1, wherein:
a first substrate is contained within the first hybrid assembly and connected the heat sink; and
a second substrate is contained within the second hybrid assembly and connected to the heat sink;
wherein the first hybrid assembly houses at least one electronic component mounted to the first substrate and the second hybrid assembly houses at least one electronic component mounted to the second substrate.

7. The electronic assembly of claim 6, further comprising a plurality of compliant lead terminations disposed around a bottom portion of the first substrate and second substrate, the lead terminations having multiple bends which allow the lead terminations to contact and be co-planar with a surface of a circuit board to which the electronic assembly is mounted.

8. An assembly comprising:
a first hybrid assembly;
a second hybrid assembly; and
a heat sink fastened to a first circuit board and extending generally perpendicular with respect to a plane of the first circuit board, and wherein the first hybrid assembly and the second hybrid assembly are mounted on either side of the heat sink so as to be disposed generally perpendicularly with respect to the plane of the first circuit board,
wherein the first hybrid assembly and the second hybrid assembly extend generally vertically between the first circuit board and a second circuit board, and wherein the heat sink has a center wall disposed between the first hybrid assembly and the second hybrid assembly.

9. The assembly of claim 8, wherein the heat sink includes a first column disposed at a first end of the heat sink, a second column disposed at a second opposing end of the heat sink, and the center wall extends between the first column and the second column, together the first column and second column form a pocket in which the first hybrid assembly and the second hybrid assembly are mounted to the center wall.

10. The assembly of claim 9, wherein the first column and second column have threaded holes to receive a fastener that connects the electronic assembly to a circuit board.

11. The assembly of claim 9, wherein the first hybrid assembly and the second hybrid assembly are affixed to either side of the center wall of the heat sink between the first column and the second column and contact the circuit board via lead terminations.

12. The assembly of claim 8, wherein the first hybrid assembly and the second hybrid assembly includes:
a first substrate mounted to the heat sink, a first outer cover of the first hybrid assembly covering the first substrate; and
a second substrate mounted to the heat sink, a second outer cover of the second hybrid assembly covering the second substrate;
wherein the first hybrid assembly houses at least one electronic component mounted to the first substrate and the second hybrid assembly houses at least one electronic component mounted to the second substrate.

13. The assembly of claim 12, further comprising a plurality of compliant lead terminations disposed around a bottom portion of the first substrate and second substrate, the lead terminations having multiple bends which allow the lead terminations to contact and be co-planar with a surface of the circuit board.

14. The assembly of claim 8, further comprising:
an electronic box housing the electronic assembly and the circuit board, the electronic box additionally housing a plurality of circuit boards with one or more electronic assemblies mounted thereto.

15. A heat sink for an electronic assembly comprising:
a first column, the first column having a substantially cylindrical shape;
a second column disposed at a second opposing end from the first column, the second column having a substantially cylindrical shape; and
a generally flat center wall extending between the first column and the second column.

16. The heat sink of claim 15, wherein first column and second column have threaded holes to receive a fastener that connects the heat sink to a circuit board.

17. The heat sink of claim 16, further comprising a first hybrid assembly and a second hybrid assembly that are affixed to either side of the center wall of the heat sink between the first column and the second column.

18. The heat sink of claim 17, wherein the heat sink is mounted on a circuit board so as to extend generally perpendicular to a plane of the circuit board, and wherein the heat sink has a center wall disposed between the first hybrid assembly and the second hybrid assembly.

19. The heat sink of claim 17, wherein the first hybrid assembly and the second hybrid assembly includes:
a first substrate mounted to the heat sink and disposed under the first hybrid assembly;
a second substrate mounted to the heat sink and disposed under the second hybrid assembly; and
wherein the first hybrid assembly houses at least one electronic component mounted to the first substrate and the second hybrid assembly houses at least one electronic component mounted to the second substrate.

\* \* \* \* \*